United States Patent [19]

Erben

[11] 4,211,935

[45] Jul. 8, 1980

[54] ELECTRONIC PRESSURE SWITCH

[75] Inventor: Ludwig Erben, Mönchen-Gladbach, Fed. Rep. of Germany

[73] Assignee: Trützschler GmbH & Co. KG, Mönchen-Gladbach, Fed. Rep. of Germany

[21] Appl. No.: 887,214

[22] Filed: Mar. 16, 1978

[30] Foreign Application Priority Data

Mar. 16, 1977 [DE] Fed. Rep. of Germany ....... 2711346

[51] Int. Cl.² ........................................... H01H 35/34
[52] U.S. Cl. .................................... 307/118; 361/181; 200/81.4
[58] Field of Search ................ 307/116, 118; 361/181; 335/206; 340/686, 626; 200/81.4, 83 R, 83 L, 83 N, 83 S, 83 SA, 81 R, 81.5

[56] References Cited

U.S. PATENT DOCUMENTS

| 3,086,109 | 4/1963 | Kaehms | 361/181 |
| 3,206,572 | 9/1965 | Buehler | 200/83 L |
| 3,859,619 | 1/1975 | Ishihara | 200/83 L |
| 3,911,393 | 10/1975 | Biggs | 200/83 N |
| 4,090,091 | 5/1978 | Brown | 340/686 |

Primary Examiner—Gerald P. Tolin
Attorney, Agent, or Firm—Spencer & Kaye

[57] ABSTRACT

An electronic pressure switch composed of a flexible diaphragm carrying a conductive plate and two axially displaceable electronic proximity switch members each disposed at a respective opposite side of the diaphragm, each switch member being arranged to be actuated upon movement of the plate to within a predetermined distance therefrom, under the action of a pressure medium acting on one side of the diaphragm.

6 Claims, 1 Drawing Figure

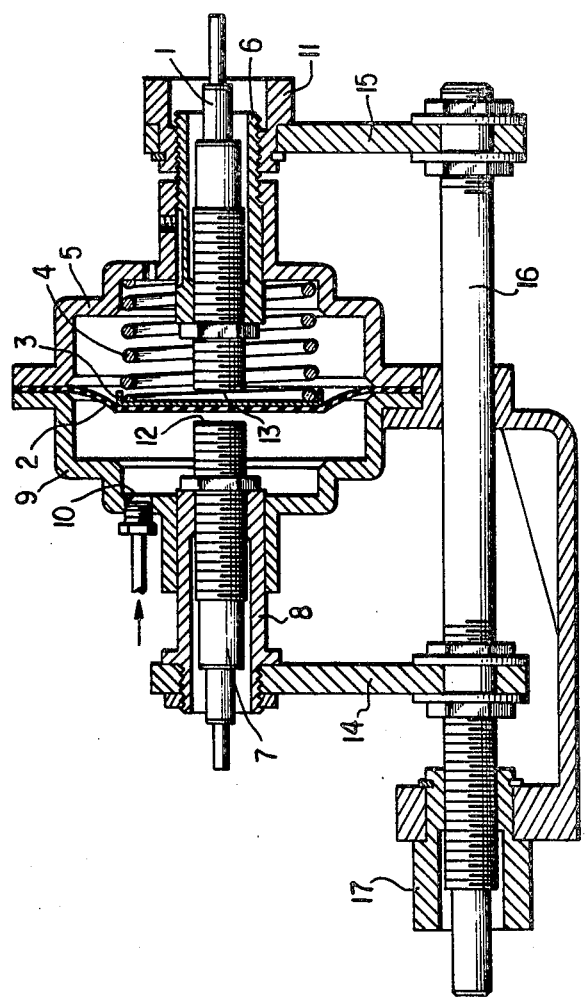

ELECTRONIC PRESSURE SWITCH

BACKGROUND OF THE INVENTION

The present invention relates to an electronic pressure switch having an axially displaceable electronic proximity switch member and a diaphragm carrying a metal plate, both the diaphragm and the plate being arranged perpendicularly to the axis of, and spaced from, the proximity switching unit, and a compression spring arranged coaxially around the proximity switch member and supported at one end on the metal plate.

In a known electronic pressure switch, a pressure medium acts on the side of the diaphragm remote from the compression spring so that with increasing pressure against the diaphragm and the metal plate, the spring is compressed. When a preselected setting pressure has been reached, the metal plate enters the switching, or sensing, range of the electronic proximity switch member. Such a switch member can be constructed to operate inductively and contains a thyristor which is thus activated and places a voltage across the output of the switch. When the pressure drops to below the preselected switch-on pressure, the thyristor opens so that the voltage across the switch output disappears again.

This electronic pressure switch is part of a control circuit in which the diaphragm is the measuring member and the electronic proximity switch member constitutes the regulating member. However, such a pressure switch can be used only for two-point regulation in which the switching on and off process occurs when a certain given pressure is passed.

SUMMARY OF THE INVENTION

It is an object of the present invention to provide an electronic pressure switch of the above described type which permits a three-point regulation.

This and other objects are achieved, according to the present invention, in an electronic pressure switch including a first axially displaceable electronic proximity switch member and a diaphragm carrying a metal plate oriented perpendicularly to the axis of, and at a distance from, the proximity switch, the diaphragm being movable toward the member in response to the pressure of a medium to be monitored, and a compression spring arranged coaxially around the proximity switch member and bearing with one end on the metal plate to urge the plate and the diaphragm away from the switch member, the switch member being disposed to one side of the diaphragm and cooperating with the plate to be actuated when the distance between the plate and the switch member becomes less than a selected value, by the provision of a second electronic proximity switch member disposed at the side of the diaphragm facing away from the first electronic proximity switch member, the second proximity switch member cooperating with the plate to be actuated when the distance between the plate and the second member becomes less than a selected value, and means supporting the second member for axial displacement relative to the diaphragm.

Due to the fact that a second electronic proximity switch member is disposed at the side of the diaphragm facing away from the first electronic proximity switch member, both members cooperate with a common diaphragm which lies between their active surfaces. As a result, only one compression spring is required.

With such a structure, the electronic pressure switch is capable of effecting three-point regulation since two threshold value contacts are provided. Thus, whenever the diaphragm takes on a position which is situated within a region between two boundary, or threshold, positions located between the two active surfaces, both proximity switches are open. When the diaphragm is displaced past one of the threshold planes, one of the electronic proximity switch members is closed.

Advantageously, the second electronic proximity switch member is disposed in a pressure-tight housing which is provided on the side of the diaphragm facing away from the first electronic proximity switch member. Thus it is easier to detect differences in pressure so that the electronic pressure switch of this embodiment is particularly suitable as a fine, or high sensitivity, pressure switch.

According to an advantageous embodiment of the invention, the first and second electronic proximity switch members are axially displaceable together, i.e. as a unit, so that the distance between their mutually facing active surfaces always remains constant. This embodiment can advisably be constructed, for example, so that both electronic proximity switch members are connected together by means of a common adjustment device. This permits common adjustment of the two inductive proximity switch members since their inductive threshold value contacts can be axially displaced together.

A further advantage is that the distance between the two threshold positions, or planes, remains almost constant over a wide range because only one compression spring is used for both switch members.

The common adjustment can be made particularly precise if the adjustment device operates in a positive locking manner, e.g. via gear wheels, threads, or the like, so that there is practically no play. According to a further advantageous embodiment of the invention, at least one of the two proximity switch members is displaceable individually so that it is possible to increase or decrease the distance between the threshold positions.

BRIEF DESCRIPTION OF THE DRAWING

The sole FIGURE is a partly cross-sectional elevational view of a preferred embodiment of the invention.

DESCRIPTION OF THE PREFERRED EMBODIMENTS

The FIGURE illustrates an electronic pressure switch including a first proximity switch member 1 which is axially displaceably mounted in an adjustment sleeve 6. Proximity switch devices are abundantly well known in the art and any suitable known device can be employed as member 1. At a distance from the active surface 13 of member 1, a diaphragm 2, e.g. of rubber, is disposed and is provided with a metal plate 3 on its side facing the proximity switch member 1. Diaphragm 2 and plate 3 both extend perpendicular to the axis of member 1. A compression spring 4 is disposed coaxially around the proximity switch member 1 and one of its ends is supported on the metal plate 3. Its other end is supported at the frontal face of an axially symmetrical housing 5 which encloses the pressure spring 4 and the proximity switch member 1 and which supports sleeve 6. One end of housing 5 is closed by sleeve 6 and member 1 and the other end of the housing is closed by diaphragm 2.

On the side of diaphragm 2 facing away from the first electronic proximity switch member 1, a second electronic proximity switch member 7, which can be identical to member 1, is disposed to be axially displaceable in an adjustment sleeve 8, in a direction coaxial with the direction of displacement of the first electronic proximity switch member 1. The second electronic proximity switch member 7 is enclosed by an axially symmetrical housing 9 which is connected with the first housing 5, for example, by means of screws connecting exterior flanges of the two housings. An opening 10 is provided in housing 9 to introduce compressed air. Housing 9 has one end closed by member 7 and sleeve 8 and its other end closed by diaphragm 2.

On its side facing away from diaphragm 2, the displacement sleeve 6 of the first electronic proximity switch member 1 is provided with an external thread onto which an adjustment nut 11 is screwed. In this way the proximity switch member 1 can be displaced individually, i.e. independently of member 7, so that it is possible in this way to increase or decrease the distance between the two threshold positions, each active surfaces 12 and 13.

In order to permit the first and second electronic proximity switch members 1 and 7 to be displaced as a unit relative to diaphragm 2, the adjustment sleeve 8 and the adjustment nut 11 are each secured to a respective one of two mounts 14 and 15 which are both firmly attached to a common spindle 16. This spindle 16 is longitudinally displaceable by means of a rotating handle 17 which threadedly engages spindle 16. Mounts 14 and 15 are attached to elements 8 and 11, as well as to spindle 16, to move as a unit therewith in the direction of the axes of members 1 and 7.

In operation, a stream of air whose pressure is to be regulated or monitored enters into housing 9 through opening 10 and acts on diaphragm 2. This causes the distance of diaphragm 2 from the active surface 12 of the second proximity switch member 7 as well as from the active surface 13 of the first proximity switch member 1 to be changed. When the diaphragm 2, or more precisely plate 3, reaches or passes one of the threshold positions, located at a certain distance from one of active surfaces 12 and 13, a voltage appears across the output of that one of the first electronic proximity switch member 1 and the second electronic proximity switch member 7 toward which the plate is moving so that this switch is able to switch on a setting member (not shown). When the pressure drops, and thus the plate 3 is deflected in the opposite direction, back past the same threshold position, the voltage disappears so that the setting member is switched off again.

It will be understood that the above description of the present invention is susceptible to various modifications, changes and adaptations, and the same are intended to be comprehended within the meaning and range of equivalents of the appended claims.

What is claimed is:

1. In an electronic pressure switch including a first axially displaceable electronic proximity switch member and a diaphragm carrying a metal plate oriented perpendicularly to the axis of, and at a distance from, the proximity switch member, the diaphragm being movable toward the member in response to the pressure of a medium to be monitored, and a compression spring arranged coaxially around the proximity switch member and bearing with one end on the metal plate to urge the plate and the diaphragm away from the switch member, the switch member being disposed to one side of the diaphragm and cooperating with the plate to be actuated when the distance between the plate and the switch member becomes less than a selected value, the improvement comprising: a second electronic proximity switch member disposed at the side of said diaphragm facing away from said first electronic proximity switch member, said second proximity switch member cooperating with said plate to be actuated when the distance between said plate and said second member becomes less than a selected value; and means supporting said first and second electronic proximity switch members for movement as a unit relative to said diaphragm in the direction of their axes in a manner to maintain the spacing therebetween in such axial direction constant.

2. An arrangement as defined in claim 1 wherein said supporting means comprises a common adjustment device connecting said first and second switch members together.

3. An arrangement as defined in claim 2 wherein said adjustment device is constructed to cooperate with said first and second switch members in a positive locking manner.

4. An arrangement as defined in claim 1 wherein said supporting means comprise an additional adjustment device connected for displacing one of said proximity switch members individually in the direction of its axis to vary the distance between said first and second switch members.

5. In an electronic pressure switch including a first axially displaceable electronic proximity switch member and a diaphragm carrying a metal plate oriented perpendicularly to the axis of, and at a distance from, the proximity switch member, the diaphragm being movable toward the member in response to the pressure of a medium to be monitored, and a compression spring arranged coaxially around the proximity switch member and bearing with one end on the metal plate to urge the plate and the diaphragm away from the switch member, the switch member being disposed to one side of the diaphragm and cooperating with the plate to be actuated when the distance between the plate and the switch member becomes less than a selected value, the improvement comprising: a second electronic proximity switch member disposed at the side of said diaphragm facing away from said first electronic proximity switch member, said second proximity switch member cooperating with said plate to be actuated when the distance between said plate and said second member becomes less than a selected value; and means supporting said second member for axial displacement relative to said diaphragm, and wherein said compression spring constitutes the only spring member of said switch and provides the only force acting on said diaphragm in the absence of action of a pressure medium against said diaphragm.

6. An arrangement as defined in claim 1 further comprising a pressure-tight housing in which said second switch member is disposed and which is located at the side of said diaphragm facing away from said first electronic proximity switch member.

* * * * *